United States Patent
McGrath

(10) Patent No.: US 8,891,708 B2
(45) Date of Patent: Nov. 18, 2014

(54) OBTAINING A DESIRED NON-ZERO PHASE SHIFT USING FORWARD-BACKWARD FILTERING

(75) Inventor: David McGrath, Rose Bay (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 565 days.

(21) Appl. No.: 13/258,338

(22) PCT Filed: Apr. 1, 2010

(86) PCT No.: PCT/US2010/029582
§ 371 (c)(1),
(2), (4) Date: Sep. 21, 2011

(87) PCT Pub. No.: WO2010/117867
PCT Pub. Date: Oct. 14, 2010

(65) Prior Publication Data
US 2012/0019723 A1    Jan. 26, 2012

Related U.S. Application Data

(60) Provisional application No. 61/168,350, filed on Apr. 10, 2009.

(51) Int. Cl.
  *H04B 1/10*    (2006.01)
  *H04S 3/00*    (2006.01)
  *H03H 17/08*   (2006.01)
  *G10L 19/008*  (2013.01)
  *H04S 3/02*    (2006.01)

(52) U.S. Cl.
  CPC ............... *H04S 3/002* (2013.01); *H03H 17/08* (2013.01); *G10L 19/008* (2013.01); *H04S 3/02* (2013.01)
  USPC ........... 375/350; 375/233; 375/232; 375/229; 375/285; 375/348

(58) Field of Classification Search
  USPC .................. 375/233, 350, 232, 229, 285, 348
  See application file for complete search history.

(56) References Cited

U.S. PATENT DOCUMENTS

| 5,463,424 A | 10/1995 | Dressler |
| 2010/0083344 A1 | 4/2010 | Schildbach |
| 2011/0051800 A1 | 3/2011 | Schug |

FOREIGN PATENT DOCUMENTS

| WO | 2011/015369 | 2/2011 |
| WO | 2011/110525 | 9/2011 |

OTHER PUBLICATIONS

Rader, et al., "Approximating Noncausal IIR Digital Filters Having Arbitrary poles, Including New Hilbert Transformer Designs, Via Forward/Backward Block Recursion" IEEE Transactions on Circuits and Systems Part I: Regular Papers, IEEE Service Center, New York, NY, vol. 53, No. 12, Dec. 1, 2006, pp. 2779-2787.

Gustaffson, Fredrik, "Determining the Initial States in Forward-Backward Filtering" IEEE Transactions on Signal Processing, IEEE Service Center, New York, NY, USA, vol. 44 No. 4, Apr. 1, 1996, pp. 988-992.

*Primary Examiner* — Leila Malek

(57) ABSTRACT

Forward and backward filters in cascade establish a specified phase shift in audio or video signals. The backward filter applies its filtering in a backward direction to impart a phase shift to its backward-filtered output that is a function of frequency. The forward filter applies its filtering in a forward direction to impart a phase shift to its forward-filtered output that has the specified phase shift relative the phase shift of the backward filter. Preferably, the two filters are recursive and are applied to signals that represent overlapping segments of the audio or video information. The overlap interval is used for filter initialization.

18 Claims, 5 Drawing Sheets

US 8,891,708 B2

OBTAINING A DESIRED NON-ZERO PHASE SHIFT USING FORWARD-BACKWARD FILTERING

CROSS-REFERENCE TO RELATED APPLICATIONS

This present application claims priority to U.S. Patent Provisional Application No. 61/168,350 filed 10 Apr. 2009 which is hereby incorporated by reference in its entirety.

TECHNICAL FIELD

The present invention pertains to the processing of audio or video signals, especially audio and video signal processing that obtains a desired non-zero phase shift.

BACKGROUND ART

Audio and video signals are processed in many applications to obtain a desired phase shift. For example, some implementations of multichannel audio matrix coding use a variety of filtering techniques to impart a ninety-degree phase shift in so-called surround channels so that a matrix can combine the surround channels with the left and right front channels in a way that preserves the relative energy or power of the left and right channels. This improves the fidelity of playback systems that do not have a matrix decoder but instead playback the matrixed left and right channels.

Known filtering techniques for obtaining a ninety-degree phase shift have limitations and disadvantages. Some of the filtering techniques used with multichannel audio matrix coding apply a filter to both the surround channels as well as the front channels to obtain a relative phase shift of ninety-degrees between these channels. Preferably, the phase shift should be obtained without shifting the phase of the front channels. Other techniques use finite impulse response (FIR) filters to approximate the non-causal infinite impulse response of the Hilbert transform; however, these FIR implementations are computationally intensive and must truncate the infinite impulse response. As a result, these FIR implementations can only approximate the response with limited accuracy and must tradeoff the degree of accuracy with the computational efficiency.

DISCLOSURE OF INVENTION

It is an object of the present invention to provide for a filtering technique that can establish a desired phase shift in a single audio or video signal with improved accuracy and computational efficiency.

This object is achieved by the filtering technique described below.

The various features of the present invention and its preferred implementations may be better understood by referring to the following discussion and the accompanying drawings in which like reference numerals refer to like elements in the several figures. The contents of the following discussion and the drawings are set forth as examples only and should not be understood to represent limitations upon the scope of the present invention.

MODES FOR CARRYING OUT THE INVENTION

A. Introduction

Figure 1A:
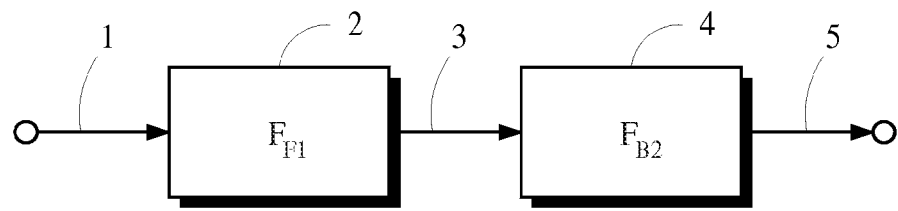
FIGS. 1A and 1B are block diagrams of filtering systems with two filters in cascade.
Figure 1B:
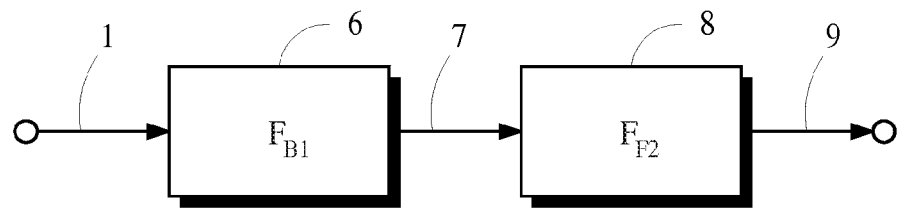

FIGS. 1A and 1B are block diagrams of filtering systems with two filters in cascade that may be used to established a desired phase shift in an audio or video signal. Referring to the implementation shown in FIG. 1A, the filtering component 2 is applied to an audio or video input signal received from the path 1 and generates a filtered signal along the path 3.

The filtering component 4 is applied to the filtered-signal received from the path 3 and generates a filtered output signal with a desired phase shift along the path 5. The filtering component 2 contains a "forward filter" $F_{F1}$ that applies its filtering operation to the input audio or video signal in the order the signal is received. The direction of this order is referred to as the forward direction. The filtering component 4 contains a "backward filter" $F_{B2}$ that applies its filtering operation to its input signal in an order that is opposite to the forward direction. The direction of this order is referred to as the backward direction. This is explained in more detail below. The filtering operation of the backward filter $F_{B2}$ is implemented by a filter $F_2$ with a phase response that is a function of frequency. The filtering operation of the forward filter $F_{F1}$ is implemented by a filter $F_1$ with a phase response expressed as a function of frequency relative to the phase response of the filter $F_2$ that defines the overall phase-shift established by the two filters in cascade.

Referring to the implementation shown in FIG. 1B, the filtering component 6 is applied to an audio or video input signal received from the path 1 and generates a filtered signal along the path 7. The filtering component 8 is applied to the filtered-signal received from the path 7 and generates a filtered output signal with a desired phase shift along the path 9. The filtering component 6 contains a "backward filter" $F_{B1}$ that applies its filtering operation to the input audio or video signal in the backward direction. The filtering component 8 contains a "forward filter" $F_{F2}$ that applies its filtering operation to its input signal in the forward direction. The filtering operation of the backward filter $F_{B1}$ is implemented by a filter $F_1$ with a phase response that is a function of frequency. The filtering operation of the forward filter $F_{F2}$ is implemented by a filter $F_2$ with a phase response expressed as a function of frequency relative to the phase response of the filter $F_1$ that defines the overall phase-shift established by the two filters in cascade.

It is anticipated that the filtering system will normally receive the input signal and generate the filtered output signal in presentation order, which is the order in which the video or audio signal is presented to an audience; however, the input signal may be received and processed in reverse order and the filtered output signal may be generated in reverse order if desired. The minor changes in implementation that are needed for this alternative are readily apparent and are not discussed further.

The principle of the present invention may be used to establish essentially any phase shift that may be desired but it is anticipated that these principles may be used advantageously to establish a phase-shift that is substantially equal to a specified amount of phase shift that differs significantly from zero for most if not all of the input signal bandwidth. This type of phase response is referred to herein as a phase-shift that is a non-zero function of frequency. The desired amount of phase shift may be invariant as a function of frequency or it may vary in some prescribed way.

Figure 2:
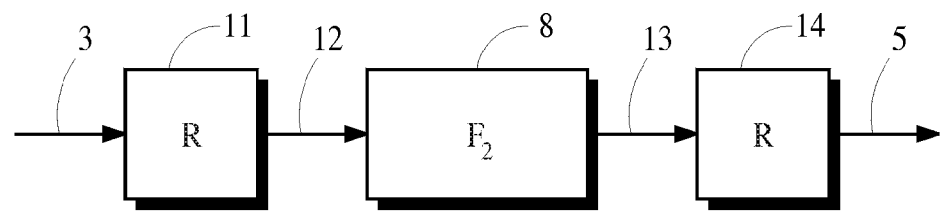
FIG. 2 is a block diagram of one implementation of filtering component $F_{B2}$ shown in FIG. 1A.

As mentioned above, the backward filter $F_{B2}$ applies the filtering operation of the filter $F_2$ to the filtered signal received from the path 3 in an order that is reversed from the order the filtered signal was generated by the forward filter $F_{F1}$. FIG. 2 is a block diagram of one way the backward filter $F_{B2}$ may be implemented. In this implementation, the reversal component 11 receives a filtered signal from the path 3 and generates a signal along the path 12 that represents the filtered signal in reversed order. In other words, the last portion of the signal generated along the path 12 was output by the filter $F_1$ first and the first portion of the signal generated along the path 12 was output by the filter $F_1$ last. The filter $F_2$ is applied to this reversed signal and its filtered output is subsequently reversed by the reversal component 14. The signal that is generated along the path 5 has the same order as the signal received from the path 3 but it has been filtered by a backward filtering operation of the filter $F_2$.

The backward filter $F_{B1}$ shown in FIG. 1B may be implemented in a similar manner by interposing the filter $F_1$ between two reversal components.

Figure 3:
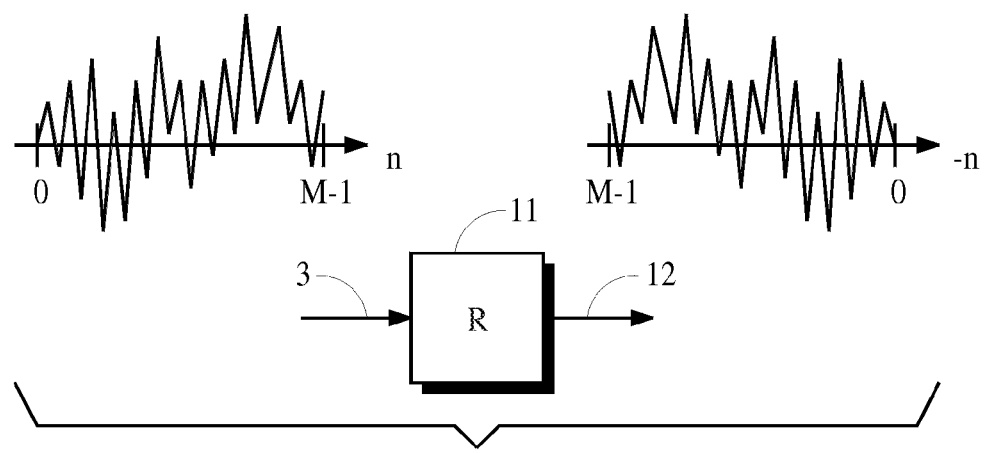
FIG. 3 is a block diagram illustrating the operation performed by one of the signal reversal components shown in FIG. 2.

Conceptually, the reversal component changes the order of its input signal but this component may be implemented in a wide variety of ways. It can be implemented for digital signals by storing the digital signal samples in a first-in-last-out (FILO) buffer in which pointers are used to store and retrieve signal samples in whatever order is desired. The effective reversal that is achieved by the reversal component 11 is illustrated in FIG. 3. The figure shows a signal represented by M samples on the left-hand side of the drawing being received in an order where sample number 0 is received first and sample M−1 is received last. The output of the reversal component 11 is shown on the right-hand side of the drawing in which the sample M−1 is generated first and the sample 0 is generated last. The reversal component 14 performs the same type of process and may be implemented to operate in the same manner.

B. Reduced Delays

1. Signal Segmentation

This basic implementation is not practical for many real-time or near-real-time applications. The implementation shown in FIG. 1A incurs a delay in its output at least as long as the duration of the signal to be filtered because the entire signal must be buffered before the backward filter can be applied. The delay incurred by the implementation shown in FIG. 1B is also at least as long as the duration of the signal to be filtered.

Figure 4:
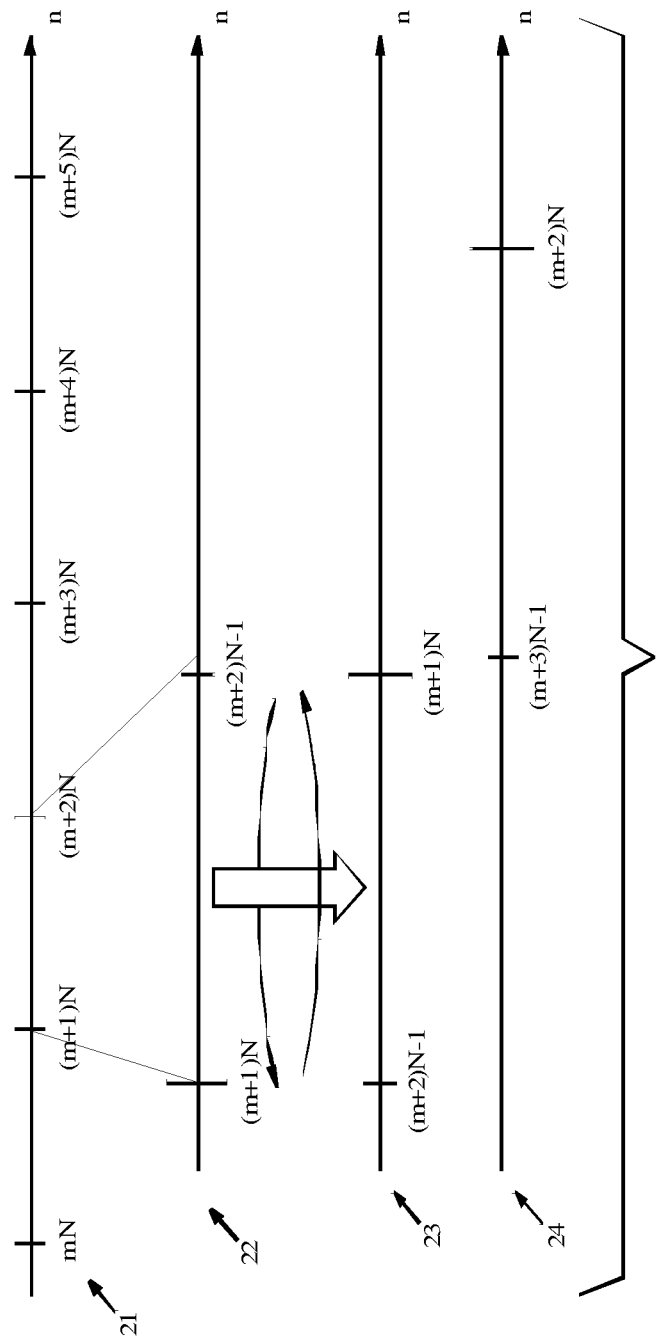
FIG. 4 is a graphical illustration of reversed signal segments.

The amount of delay can be reduced by dividing signals into segments and reversing the order of each segment. An example is illustrated in FIG. 4. A digital signal is divided into a series of segments 21 each including N digital samples. Five complete segments are shown. The first segment shown in the figure includes samples numbered from mN to (m+1)N−1. The last segment shown includes samples numbered from (m+4)N to (m+5)N−1.

The second segment, which includes samples numbered from (m+1)N to (m+2)N−1, is shown separately as the segment 22. A reversal component such as the reversal component 11 discussed above may be used to reverse the order of the samples in this segment as shown graphically by the arrows between the segment 22 and the reversed segment 23. The reversed segment 23 includes samples in order from (m+2)N−1 to (m+1)N. A reversal of the third illustrated segment, shown as the reversed segment 24, includes samples in order from (m+3)N−1 to (m+2)N.

If the series of segments 21 represent a portion of the filtered-signal output by the filtering component 2 along the path 3, for example, the backward filter $F_{B2}$ is applied to this filtered signal by reversing segments of the filtered signal and applying the filtering operation of the filter $F_2$ to each reversed segment. In the example illustrated, the filtering operation of the filter $F_2$ that implements the filtering component 4 is applied to the reversed segment 24 after being applied to the reversed segment 23.

2. Overlapping Segmentation

If the filters $F_1$ and $F_2$ are implemented as recursive filters, the simple segmentation technique described above usually will not provide acceptable results because each filter is not initialized properly at the beginning of each segment. The state of a recursive filter is affected by its history but the filter has no history when it begins filtering one of the reversed segments described above. As a result, the output generated by the filter at the beginning of each segment will generally deviate significantly from the output that would have been obtained had that same filter been applied to the full duration of the reversed signal. The amount of deviation or error in filter output diminishes as the filtering operation is applied to the remainder of the reversed segment.

The amount of error can be reduced by providing the filter with enough signal history that it can initialize itself property at the start of the reversed segment. Because the filter is applied to a reversed signal, however, this "history" is actually a future portion of the unreversed signal. For this reason, this portion is referred to as a look-ahead interval. This is illustrated in FIG. 5.

Figure 5:
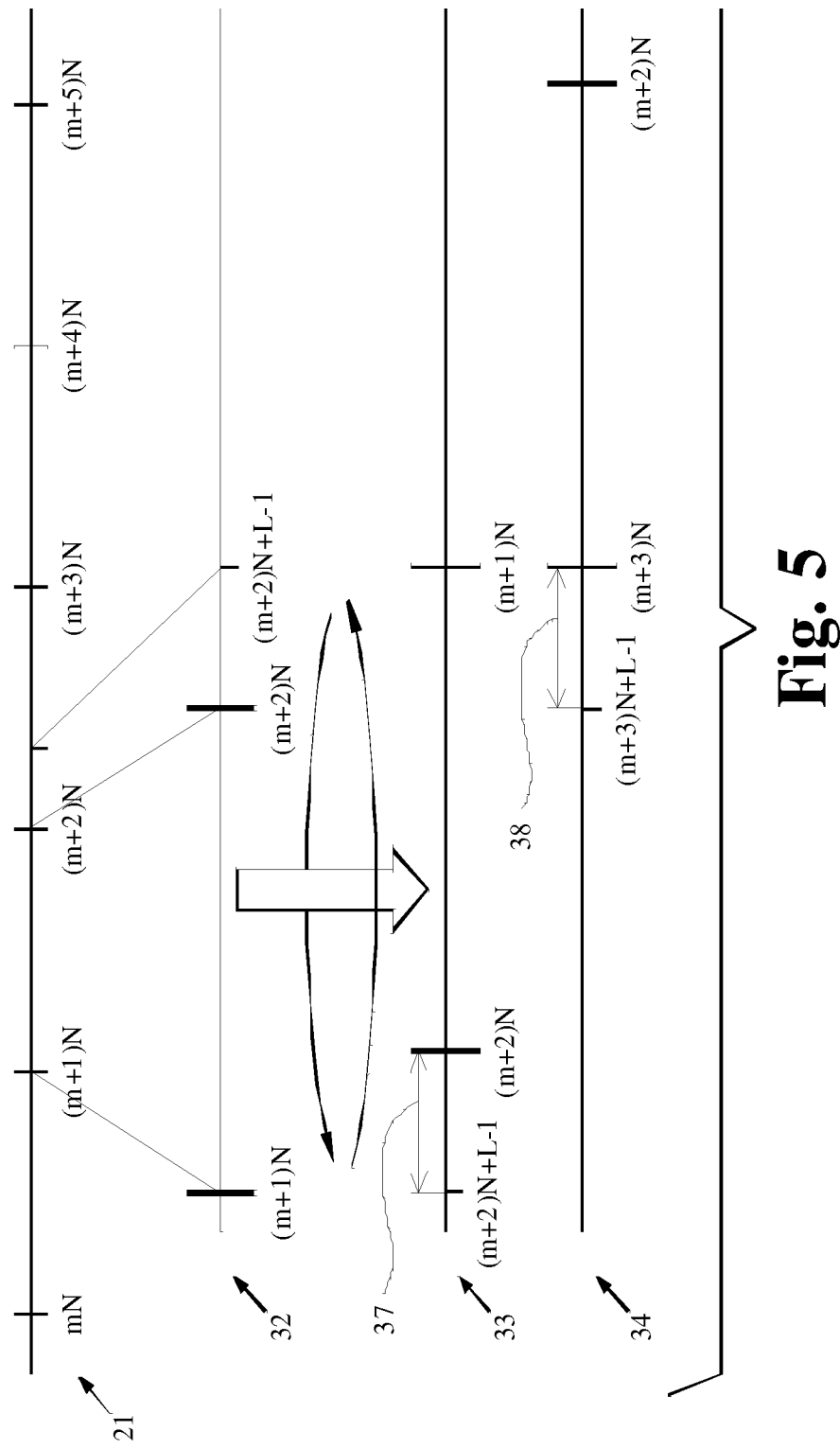
FIG. 5 is a graphical illustration of reversed overlapping signal segments.

Referring to FIG. 5, a digital signal is divided into a series of segments 21. The start of each segment is separated by N samples from the start of an adjacent segment as discussed above in connection with FIG. 4 but each segment includes N+L samples. The additional L samples constitute a look-ahead interval that overlaps one or more of the following segments. In the example shown, the look-ahead interval L is less than the length N of the remaining segment but the look-ahead interval L may be greater than or equal to N if desired. If it is greater, the look-ahead interval overlaps more than one segment.

The exemplary segment 32 includes samples that are numbered from (m+1)N to (m+2)N+L−1. A reversal component such as the reversal component 11 discussed above may be used to reverse the order of the samples in this segment as shown graphically by the arrows between the segment 32 and the reversed segment 33. The reversed segment 33 includes samples in order from (m+2)N+L−1 to (m+1)N. The interval 37 is the look-ahead interval for the reversed segment 33. A reversal of the next segment, shown as the reversed segment 34, includes samples in order from (m+3)N+L−1 to (m+2)N. The interval 38 is the look-ahead interval for the reversed segment 34.

Generally speaking, the accuracy of the filtered output for samples at and near the end of a reversed segment opposite the look-ahead interval is greater than the accuracy of the filtered output for samples at and near the end of the reversed segment immediately after the look-ahead interval. The length of the look-ahead interval should be chosen long enough to give the recursive filter sufficient history to initialize its states so that its filtered output for the first sample following the look-ahead interval is sufficiently accurate. Referring to the example shown in FIG. 5, the look-ahead interval 38 should be long enough so that the filtered output generated from the sample (m+3)N−1 is sufficiently accurate. Additional techniques are described below that can be used with the look-ahead feature to improve filter initialization.

The filter operations that are applied to samples in the look-ahead interval are used for filter-state initialization. Any filter output that may be generated from these samples is generally excluded from the output signal of the filtering system.

C. Filters

1. Exemplary Structure

Figure 6:
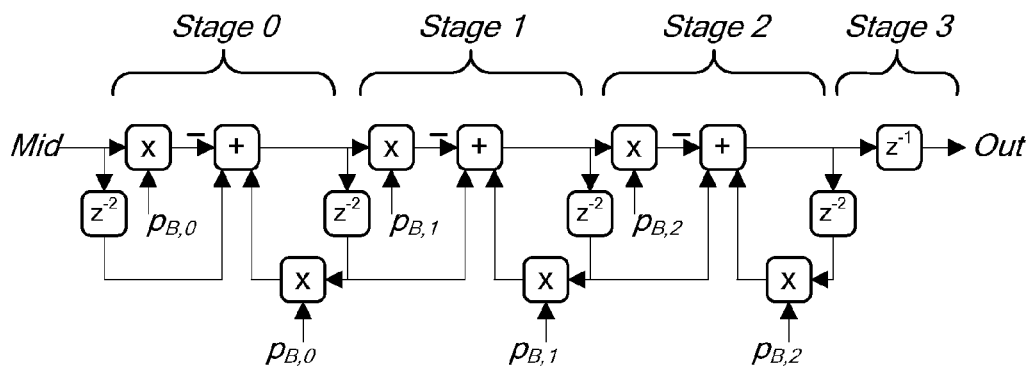
FIGS. 6 and 7 are block diagrams of exemplary implementations of the filters shown in FIGS. 1A, 1B and 2.
Figure 7:
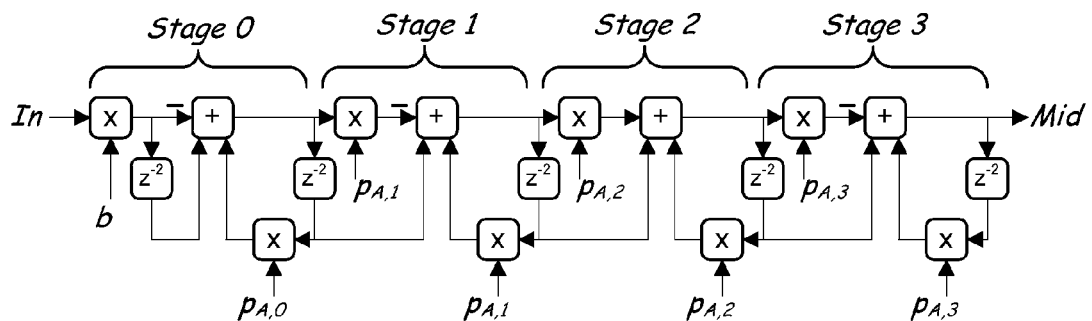

FIGS. 6 and 7 are block diagrams of exemplary recursive implementations of the filters $F_1$ and $F_2$ discussed above that may be used to establish a ninety-degree phase shift in an audio or video signal.

Referring to FIG. 6, the filter $F_1$ comprises four sections or stages. All of the stages incorporate delay elements that are two samples in length, as indicated by the notation $z^{-2}$. The first stage, denoted as Stage 0, is a bandpass filter. The remaining three stages are all-pass filters.

Referring to FIG. 7, the filter $F_2$ comprises four sections or stages of all-pass filters. The last stage, denoted as Stage 3, is a single-sample delay.

The transfer functions for these implementations of the filters $F_1$ and $F_2$ are shown in equations 1 and 2, respectively:

$$F_1 = \frac{b(z^{-2}-1)}{1-p_{A,0}z^{-2}} \times \frac{z^{-2}-p_{A,1}}{1-p_{A,1}z^{-2}} \times \frac{z^{-2}-p_{A,2}}{1-p_{A,2}z^{-2}} \times \frac{z^{-2}-p_{A,3}}{1-p_{A,3}z^{-2}} \quad (1a)$$

$$F_2 = \frac{z^{-2}-p_{B,0}}{1-p_{B,0}z^{-2}} \times \frac{z^{-2}-p_{B,1}}{1-p_{B,1}z^{-2}} \times \frac{z^{-2}-p_{B,2}}{1-p_{B,2}z^{-2}} \times z^{-1} \quad (1b)$$

The filter-tap coefficients for these implementations are as follows:

b=0.9973754883
$p_{A,0}$=0.9947509766
$p_{A,1}$=0.9791259766
$p_{A,2}$=0.8451538086
$p_{A,3}$=0.2373046875
$p_{B,0}$=0.9917602539
$p_{B,1}$=0.9426269531
$p_{B,2}$=0.6172485352

The use of the all-pass filter stages with two-sample delays enables the order of the filters to be increased without increasing the computational resources required to implement the filters. These particular filters have a pair of real poles and a pair of real zeros, in which each pole or zero has a "mirrored" pole or zero respectively. The reflection or mirroring occurs about the frequency Fs/4, where Fs is the sample rate of the signal being filtered.

2. Filter Operation

The following examples describe how the filters described above can be used with segments that have look-ahead intervals. These examples assume the filters are applied to segments of digital signals that are spaced apart by N samples and have look-ahead intervals of L samples.

Referring to the implementation shown in FIG. 1A, the filtering component 2 applies the filtering operation of the filter $F_1$ to a stream of digital samples received from the path 1 to generate a stream of filtered digital samples along the path 3. This stream of samples is arranged in overlapping segments of N+L samples each. The filtering component 4 applies the filtering operation of the filter $F_2$ to each segment in an order that is reversed from the order the filtered digital samples were generated by the filtering component 2. This may be done by reversing the order of each segment as shown in FIG. 5 and then presenting each reversed segment to the filter $F_2$ for filtering. The filter $F_2$ generates output segments of N+L samples for each segment it filters. The filtered samples from the look-ahead interval, which are the first L samples of each segment generated by the filter $F_2$, are generally not included in the output signal of this filtering system and can be excluded from segments obtained by reversing their order. The segments generated by the filter $F_2$ are reversed and assembled to form the output signal generated along the path 5.

Referring to the implementation shown in FIG. 1B, if the input signal received from the path 1 is in its normal playback order, the filtering component 6 applies the filtering operation of the filter $F_1$ to each segment of the input signal in an order that is reversed from the playback order. This may be done by arranging the input signal in overlapping segments of N+L samples each, reversing the order of each segment as shown in FIG. 5 and then presenting each reversed segment to the filter $F_1$ for filtering. The filtered samples from the look-ahead interval, which are the first L samples of each segment generated by the filter $F_1$, are generally excluded from the segments that are reversed and assembled for input to the filter $F_2$ for its filtering.

D. Filter Error Reduction

Filter errors for samples following the look-ahead interval can be reduced by increasing the length of the look-ahead interval as explained above. Two other techniques can be used to reduce the effects of filter errors. One technique does not reduce filter errors but can be used to reduce the aural effects of filter errors by modifying the output of the backward filter. The other technique can be used to reduce filter errors by improving the initialization of the backward filter.

1. Backward Filter Output Modification

Figure 8:
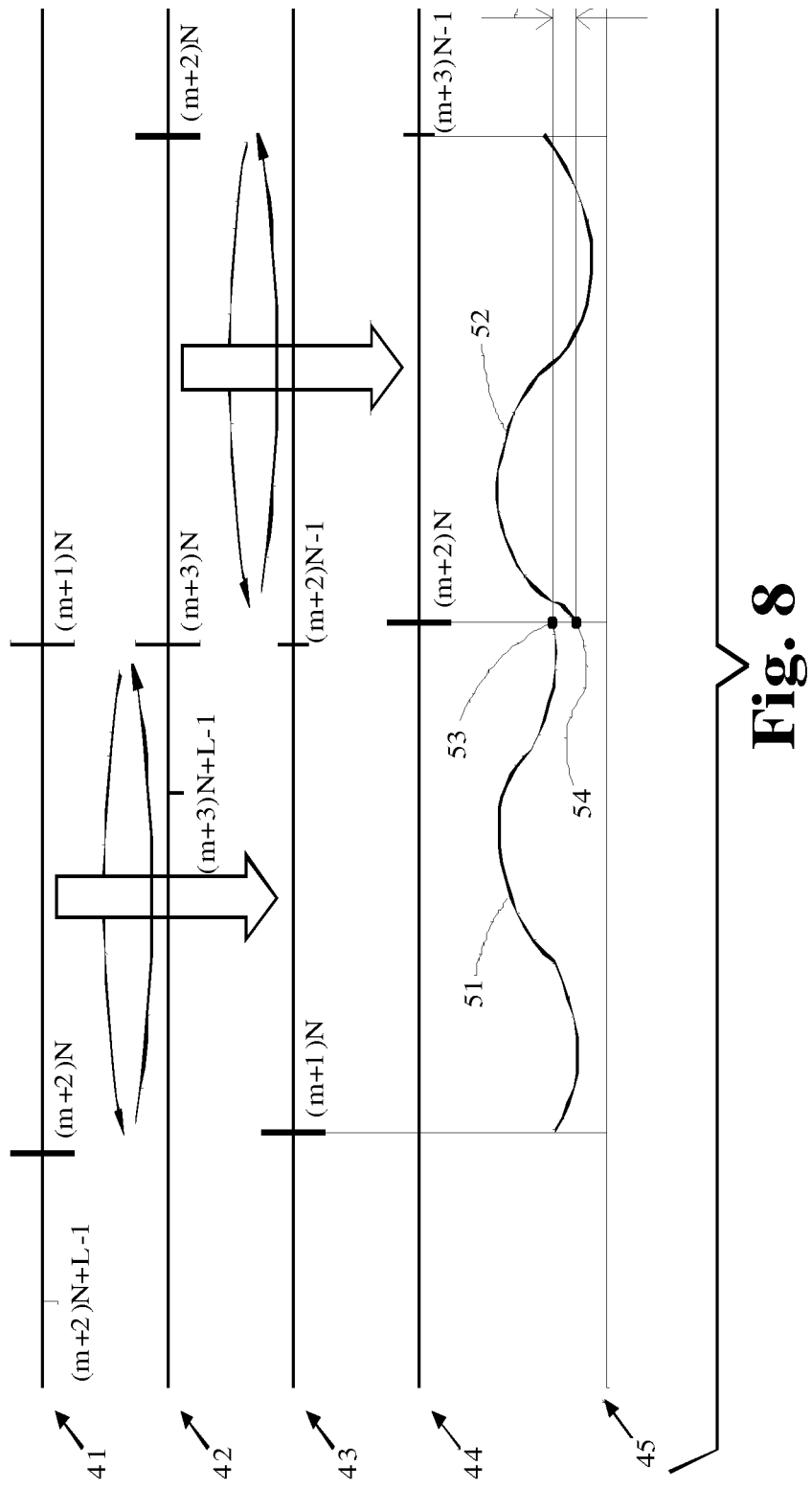
FIG. 8 is a graphical illustration of one technique that may be used to reduce filtered-signal discontinuities.

The aural effects of filter errors can be reduced by reducing discontinuities in the backward filter output between adjacent segments. FIG. 8 provides a graphical illustration of how this may be done. The example given in the following paragraphs describes how to use this technique with the backward filter in the implementation shown in FIG. 1A. This technique can also be used with the backward filter in the implementation shown in FIG. 1B in a similar manner.

Referring to FIG. 8, segments 41 and 42 represent adjacent segments generated by the filter $F_2$. Each segment includes N+L samples. For example, these segments could represent the result obtained by applying the filtering operation of filter $F_2$ to the reversed segments 33 and 34 shown in FIG. 5. The sample numbers shown in FIGS. 5 and 8 are intended to show a correspondence between samples in the different phases of processing by the filter system shown in FIG. 1A. For example, the sample number (m+2)N that is generated by the filter $F_1$ appears in two reversed segments 33, 34 that are input to the filter $F_2$. The output samples of the filter $F_2$ that correspond to the these two samples in the reversed segments 33, 34 are shown as samples (m+2)N in the segments 41, 42, respectively. The filter output sample (m+2)N in segment 41 is the output sample of the filter $F_2$ for the last sample in the look-ahead interval for the segment 41. The filter output sample (m+2)N in segment 42 is the output sample of the filter $F_2$ for the last sample in the segment 42.

The reversal component 14 reverses the order of the segments 41 and 42 to obtain segments 43 and 44. Each of these segments includes N samples. The waveforms 51 and 52 are hypothetical illustrations of the filtered and reversed outputs of the filter $F_2$ for the segments 41 and 42, respectively. The sample 53 is not part of the output for waveform 51 but represents the sample generated by the filter $F_2$ in response to the sample (m+2)N, which is the last sample in the look-ahead interval for the segment 41. The sample 54 is the last sample generated by the filter $F_2$ for the segment 42. The difference 55 between the samples 53 and 54 provides a good estimate of the filter error for the right-hand end of the waveform 51 that is caused by initialization errors for the filter $F_2$ at the end of the look-ahead interval for the segment 41.

Preferably, the amplitude of the trailing end of the waveform 51 should be modified to reduce the discontinuity with the leading end of the waveform 52 at the sample 54; however, this is not possible unless the waveform 51 is stored in a buffer and not yet output along the path 5. This buffering may not be attractive in some applications because it increases signal processing delays. Alternatively, the discontinuity can be reduced by modifying the leading end of the waveform 52 so that the sample 54 matches more closely the value of the sample 53. This implementation has the unfortunate effect of increasing filter errors but this increase is not audible if the look-ahead interval is long enough to reduce filter errors to an acceptable level. In other words, if the look-ahead interval is long enough so that filter initialization errors are sufficiently small, the modification in filter output amplitude does not audibly affect the waveform for each segment but it does eliminate clicks, pops and other artifacts caused by discontinuities between segments.

In a preferred implementation for the example shown in FIG. 8, each sample n of the waveform 52 is adjusted by an amount Adj(n), which may be expressed as:

$$\text{Adj}(n) = \Delta \frac{(N-n-1)}{N} \quad (2a)$$

where $\Delta$=the difference between samples represented by the offset 55;
n=the sample number from 0 to N−1 in the segment that is adjusted; and
N=the number of samples in the segment.
For example, the first sample 54 in the waveform is sample number n=0 and is adjusted by an amount equal to:

$$\text{Adj}(0) = \Delta \frac{(N-1)}{N} \quad (2b)$$

The last segment sample is sample number n=N−1 and is adjusted by an amount equal to:

$$\text{Adj}(N-1) = \Delta \frac{(N-(N-1)-1)}{N} = 0 \quad (2c)$$

This adjustment reduces the discontinuity to essentially zero at the boundary between the waveforms for the two segments and decreases linearly to zero across the length of the segment waveform. Alternatively, the adjustment can be reduced exponentially or in some other monotonic manner. This reduction in adjustment may be applied across the entire length of the segment waveform 52 or for some shorter distance.

2. Improved Backward Filter Initialization

The filter errors can be reduced by improving the initialization of the backward filter. This technique is used with the implementation shown in FIG. 1A because it uses filter states for the filter $F_1$ to improve initialization of the filter $F_2$.

The filter operation described above initializes the filter $F_2$ by setting its initial state to zero and allowing the filter to initialize itself by processing the look-ahead interval. Better initialization can be achieved if a good estimate of the filter state can be provided at the start of the look-ahead interval. One way that this can be done is to calculate some of the initial states for the filter $F_2$ from some of the states of the filter $F_1$ at the point that corresponds to the start of the look-ahead interval.

Referring to FIG. 7, it may be seen that the filter $F_2$ includes eight words of state memory. Each two-sample delay counts as two words of state memory. The one single-sample delay in Stage 3 need not be counted because it can share memory with the two-sample delay element in Stage 2. If these states are described using the notation StateB[x,y], where x is numbered from 0 to 3 for each delay element shown in FIG. 7 from left to right, and y is one of two memory locations in the delay element of each stage, StateB[0,0] denotes the state corresponding to the most recent sample stored in the first memory location of the delay in Stage 0, and StateB[2,1] denotes the state corresponding to the oldest sample stored in the second memory location of the delay element in Stage 2. A similar notation, StateA[x,y], can be used to describe the states in the filter $F_1$, where x is numbered from 0 to 4 for each delay element shown in FIG. 6 from left to right.

An initialization for the implementation of the filter $F_2$ discussed above and shown in FIG. 7 was developed empirically for use with the filters having the transfer functions and coefficients discussed above in connection with equations 1a and 1b. Using the notation described above, this initialization can be expressed as:

$$\begin{aligned}StateB[0,0] = \quad &(3a)\\ -0.1963724880 \times StateA&[0,0] + 0.005217236233 \times StateA[1,0] + \\ -0.04093219950 &\times StateA[2,0] + \\ 0.7994410396 \times StateA[3,0] &+ 0.2373046875 \times StateA[4,0]\end{aligned}$$

-continued $$StateB[0, 1] = \qquad (3b)$$
$$-0.1963724880 \times StateA[0, 1] + 0.005217236233 \times StateA[1, 1] +$$
$$-0.04093219950 \times StateA[2, 1] +$$
$$0.7994410396 \times StateA[3, 1] + 0.2373046875 \times StateA[4, 1]$$

$$StateB[1, 0] = 0.6783012352 \times StateA[0, 0] + \qquad (3c)$$
$$0.9836524970 \times StateA[1, 0] + 0.6426439332 \times StateA[2, 0] +$$
$$-0.6991621839 \times StateA[3, 0] + -0.2341407074 \times StateA[4, 0]$$

$$StateB[1, 1] = 0.6783012352 \times StateA[0, 1] + \qquad (3d)$$
$$0.9836524970 \times StateA[1, 1] + 0.6426439332 \times StateA[2, 1] +$$
$$-0.6991621839 \times StateA[3, 1] + -0.2341407074 \times StateA[4, 1]$$

$$StateB[2, 0] = 0 \qquad (3e)$$

$$StateB[2, 1] = 0 \qquad (3f)$$

$$StateB[3, 0] = 0 \qquad (3g)$$

$$StateB[3, 1] = 0 \qquad (3h)$$

3. Improved Efficiency for Backward Filter Initialization

In preferred implementations, processing efficiency is improved by operating only some of the stages in the backward filter during initialization as the filter is applied to the look-ahead interval. Initially, only Stage 0 operates. An increasing number of stages are operated in successive portions of the look-ahead interval until all stages are operated at the end of this interval. In one implementation where the look-ahead interval is 1024 samples and the remainder of the segment is 1024 samples, only Stage 0 is operated during the first 700 samples of the look-ahead interval. Both Stage 0 and Stage 1 are operated during the next 150 samples. Stage 0, Stage 1 and Stage 2 are operated during the next 172 samples, and finally Stage 3 is added for the last two samples in the look-ahead interval.

E. Implementation

Figure 9:
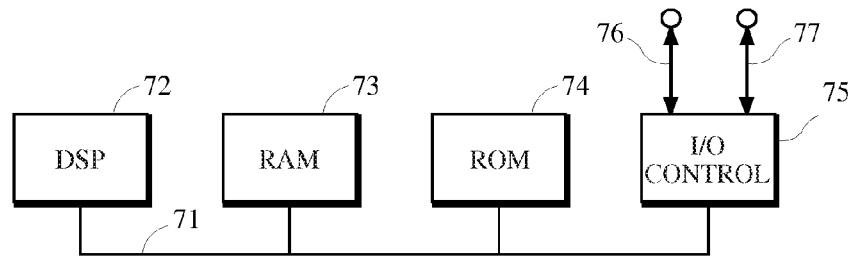
FIG. 9 is a schematic block diagram of a device that may be used to implement various aspects of the present invention.

Devices that incorporate various aspects of the present invention may be implemented in a variety of ways including software for execution by a computer, a processor or device that includes more specialized components such as digital signal processor (DSP) circuitry coupled to components similar to those found in a general-purpose computer. FIG. 9 is a schematic block diagram of a device 70 that may be used to implement aspects of the present invention. The processor 72 provides computing resources. RAM 73 is system random access memory (RAM) used by the processor 72 for processing. ROM 74 represents some form of persistent storage such as read only memory (ROM) for storing programs needed to operate the device 70 and possibly for carrying out various aspects of the present invention. I/O control 75 represents interface circuitry to receive and transmit signals by way of the communication channels 76, 77. In the embodiment shown, all major system components connect to the bus 71, which may represent more than one physical or logical bus; however, a bus architecture is not required to implement the present invention.

For implementations by a computer, additional components may be included for interfacing to devices such as a keyboard or mouse and a display, and for controlling a storage device 78 having a storage medium such as magnetic tape or disk, or an optical medium. The storage medium may be used to record programs of instructions for operating systems, utilities and applications, and may include programs that implement various aspects of the present invention.

The functions required to practice various aspects of the present invention can be performed by components that are implemented in a wide variety of ways including discrete logic components, integrated circuits, one or more ASICs and/or program-controlled processors. The reversal components mentioned above may be implemented by electronic circuitry or machine readable storage media. The manner of implementation is not important to the present invention.

Software implementations of the present invention may be recorded or stored by a variety of machine readable storage media that convey information using essentially any recording technology including magnetic tape, cards or disk, optical cards or disc, and detectable markings on media including paper.

The invention claimed is:

1. A method for filtering an input signal representing audio or video information to generate an output signal representing the audio or video information with a specified phase shift that is a non-zero function of frequency, wherein the method comprises:
receiving the input signal in a forward direction at an input terminal;
applying a forward filter and a backward filter coupled in cascade with one another to the input signal, wherein the forward filter applies its filtering operation to its input in the forward direction and the backward filter applies its filtering operation to its input in a backward direction that is opposite the forward direction; and
generating an output signal at an output terminal in response to filtered signals received from the cascade of forward and backward filters, wherein the output signal has the specified phase shift that is a non-zero function of frequency;
wherein the filtering operation of the backward filter has a phase shift that is a function of frequency and the filtering operation of the forward filter has the specified phase shift that is a non-zero function of frequency defined relative to the phase shift of the filtering operation of the backward filter, and the backward filter is applied to a series of input segments of its input signal to generate its output signal in a series of output segments, wherein:
a respective segment of input comprises a look-ahead-interval signal and a processing-interval signal following the look-ahead-interval signal in the direction the backward filter is applied, the look-ahead-interval signal also being present in one or more other input segments, and
a respective output segment comprises a filtered look-ahead-interval signal followed by a phase-shifted-signal in the direction the backward filter generated the output segment, each phase-shifted-signal generated by the backward filter being applied to the processing-interval signal of a respective input segment;
deriving an amplitude adjustment from amplitudes of:
an end of the filtered look-ahead-interval signal that is adjacent to the phase-shifted signal in a specified output segment, and
an end of the phase-shifted signal in a subsequent output segment that is opposite an end of the phase-shifted signal in the subsequent output segment that is adjacent to the filtered look-ahead-interval signal in the subsequent output segment; and
applying the amplitude adjustment to the phase-shifted signal in the subsequent output segment to reduce a difference in amplitude with an end of the phase-shifted signal that is adjacent the look-ahead-interval signal in the specified output segment, wherein the amplitude adjustment is modified so that it converges to zero as it is applied to the phase-shifted signal in the forward direction.

2. The method of claim 1, wherein the backward filter has its input coupled to the output of the forward filter and the input segments of its input signal are generated by the forward filter, and wherein the method comprises deriving at least some initial states of the backward filter prior to it being applied to the respective input segment from at least some states of the forward filter after generating at least a portion of the signal in the respective input segment.

3. A method for filtering an input signal representing audio or video information to generate an output signal representing the audio or video information with a specified phase shift that is a non-zero function of frequency, wherein the method comprises:
    receiving the input signal in a forward direction at an input terminal;
    applying a forward filter and a backward filter coupled in cascade with one another to the input signal, wherein the forward filter applies its filtering operation to its input in the forward direction and the backward filter applies its filtering operation to its input in a backward direction that is opposite the forward direction, wherein the backward filter comprises a plurality of filter stages; and
    generating an output signal at an output terminal in response to filtered signals received from the cascade of forward and backward filters, wherein the output signal has the specified phase shift that is a non-zero function of frequency;
    wherein the filtering operation of the backward filter has a phase shift that is a function of frequency and the filtering operation of the forward filter has the specified phase shift that is a non-zero function of frequency defined relative to the phase shift of the filtering operation of the backward filter;
    applying the backward filter to a series of input segments of its input signal to generate its output signal in a series of output segments, wherein:
        a respective input segment comprises a look-ahead-interval signal and a processing-interval signal following the look-ahead-interval signal in the direction the backward filter is applied, the look-ahead-interval signal also being present in one or more other input segments; and
        a respective output segment comprises a filtered look-ahead-interval signal followed by a phase-shifted-signal in the direction the backward filter generated the output segment, each phase-shifted-signal generated by the backward filter being applied to the processing-interval signal of a respective input segment; and
    initializing states of the backward filter by:
        applying less than all of the plurality of filter stages to an initial portion of a respective look-ahead-interval signal; and
        applying an increasing number of the plurality of filter stages in successive portions of the respective look-ahead-interval signal following the initial portion such that all stages in the plurality of stages are applied by the end of the look-ahead-interval signal.

4. The method of claim 3, wherein the backward filter has its input coupled to the output of the forward filter and the input segments of its input signal are generated by the forward filter, and wherein the method comprises deriving at least some initial states of the backward filter prior to it being applied to the respective input segment from at least some states of the forward filter after generating at least a portion of the signal in the respective input segment.

5. The method of claim 3 that comprises:
    deriving an amplitude adjustment from amplitudes of:
        an end of the filtered look-ahead-interval signal that is adjacent to the phase-shifted signal in a specified output segment, and
        an end of the phase-shifted signal in a subsequent output segment that is opposite an end of the phase-shifted signal in the subsequent output segment that is adjacent to the filtered look-ahead-interval signal in the subsequent output segment; and
    applying the amplitude adjustment to the phase-shifted signal in the subsequent output segment to reduce a difference in amplitude with an end of the phase-shifted signal that is adjacent the look-ahead-interval signal in the specified output segment.

6. The method of claim 5 that comprises modifying the amplitude adjustment so that it converges to zero as it is applied to the phase-shifted signal in the forward direction.

7. An apparatus for filtering an input signal representing audio or video information to generate an output signal representing the audio or video information with a specified phase shift that is a non-zero function of frequency, wherein the apparatus comprises:
    an input terminal for receiving the input signal in a forward direction;
    a processor for applying a forward filter and a backward filter coupled in cascade with one another to the input signal, wherein the forward filter applies its filtering operation to its input in the forward direction and the backward filter applies its filtering operation to its input in a backward direction that is opposite the forward direction; and
    an output terminal for generating an output signal in response to filtered signals received from the cascade of forward and backward filters, wherein the output signal has the specified phase shift that is a non-zero function of frequency;
    wherein the filtering operation of the backward filter has a phase shift that is a function of frequency and the filtering operation of the forward filter has the specified phase shift that is a non-zero function of frequency defined relative to the phase shift of the filtering operation of the backward filter, and the backward filter is applied to a series of input segments of its input signal to generate its output signal in a series of output segments, wherein:
        a respective segment of input comprises a look-ahead-interval signal and a processing-interval signal following the look-ahead-interval signal in the direction the backward filter is applied, the look-ahead-interval signal also being present in one or more other input segments, and
        a respective output segment comprises a filtered look-ahead-interval signal followed by a phase-shifted-signal in the direction the backward filter generated the output segment, each phase-shifted-signal generated by the backward filter being applied to the processing-interval signal of a respective input segment;
    an amplitude adjustment is derived from amplitudes of:
        an end of the filtered look-ahead-interval signal that is adjacent to the phase-shifted signal in a specified output segment, and
        an end of the phase-shifted signal in a subsequent output segment that is opposite an end of the phase-shifted signal in the subsequent output segment that is adjacent to the filtered look-ahead-interval signal in the subsequent output segment; and the amplitude adjustment is applied to the phase-shifted signal in the subsequent output segment to reduce a difference in amplitude with an end of the phase-shifted signal that is adjacent the look-ahead-interval signal in the specified output segment, wherein the amplitude adjustment is modified so that it converges to zero as it is applied to the phase-shifted signal in the forward direction.

8. The apparatus of claim 7, wherein the backward filter has its input coupled to the output of the forward filter and the input segments of its input signal are generated by the forward filter, and wherein at least some initial states of the backward filter are derived prior to it being applied to the respective input segment from at least some states of the forward filter after generating at least a portion of the signal in the respective input segment.

9. An apparatus for filtering an input signal representing audio or video information to generate an output signal representing the audio or video information with a specified phase shift that is a non-zero function of frequency, wherein the apparatus comprises:
an input terminal for receiving the input signal in a forward direction;
a processor for applying a forward filter and a backward filter coupled in cascade with one another to the input signal, wherein the forward filter applies its filtering operation to its input in the forward direction and the backward filter applies its filtering operation to its input in a backward direction that is opposite the forward direction, wherein the backward filter comprises a plurality of filter stages; and
an output terminal for generating an output signal in response to filtered signals received from the cascade of forward and backward filters, wherein the output signal has the specified phase shift that is a non-zero function of frequency;
wherein the filtering operation of the backward filter has a phase shift that is a function of frequency and the filtering operation of the forward filter has the specified phase shift that is a non-zero function of frequency defined relative to the phase shift of the filtering operation of the backward filter, and the backward filter is applied to a series of input segments of its input signal to generate its output signal in a series of output segments, wherein:
a respective input segment comprises a look-ahead-interval signal and a processing-interval signal following the look-ahead-interval signal in the direction the backward filter is applied, the look-ahead-interval signal also being present in one or more other input segments; and
a respective output segment comprises a filtered look-ahead-interval signal followed by a phase-shifted-signal in the direction the backward filter generated the output segment, each phase-shifted-signal generated by the backward filter being applied to the processing-interval signal of a respective input segment; and
states of the backward filter are initialized by:
applying less than all of the plurality of filter stages to an initial portion of a respective look-ahead-interval signal; and
applying an increasing number of the plurality of filter stages in successive portions of the respective look-ahead-interval signal following the initial portion such that all stages in the plurality of stages are applied by the end of the look-ahead-interval signal.

10. The apparatus of claim 9, wherein the backward filter has its input coupled to the output of the forward filter and the input segments of its input signal are generated by the forward filter, and wherein at least some initial states of the backward filter are derived prior to it being applied to the respective input segment from at least some states of the forward filter after generating at least a portion of the signal in the respective input segment.

11. The apparatus of claim 9 wherein:
an amplitude adjustment is derived from amplitudes of:
an end of the filtered look-ahead-interval signal that is adjacent to the phase-shifted signal in a specified output segment, and
an end of the phase-shifted signal in a subsequent output segment that is opposite an end of the phase-shifted signal in the subsequent output segment that is adjacent to the filtered look-ahead-interval signal in the subsequent output segment; and
the amplitude adjustment is applied to the phase-shifted signal in the subsequent output segment to reduce a difference in amplitude with an end of the phase-shifted signal that is adjacent the look-ahead-interval signal in the specified output segment.

12. The apparatus of claim 11 wherein the amplitude adjustment is modified so that it converges to zero as it is applied to the phase-shifted signal in the forward direction.

13. A non-transitory storage medium recording a program of instructions that is executable by a processor to perform a method for filtering an input signal representing audio or video information to generate an output signal representing the audio or video information with a specified phase shift that is a non-zero function of frequency, wherein the method comprises:
receiving the input signal in a forward direction at an input terminal;
applying a forward filter and a backward filter coupled in cascade with one another to the input signal, wherein the forward filter applies its filtering operation to its input in the forward direction and the backward filter applies its filtering operation to its input in a backward direction that is opposite the forward direction; and
generating an output signal at an output terminal in response to filtered signals received from the cascade of forward and backward filters, wherein the output signal has the specified phase shift that is a non-zero function of frequency;
wherein the filtering operation of the backward filter has a phase shift that is a function of frequency and the filtering operation of the forward filter has the specified phase shift that is a non-zero function of frequency defined relative to the phase shift of the filtering operation of the backward filter, and the backward filter is applied to a series of input segments of its input signal to generate its output signal in a series of output segments, wherein:
a respective segment of input comprises a look-ahead-interval signal and a processing-interval signal following the look-ahead-interval signal in the direction the backward filter is applied, the look-ahead-interval signal also being present in one or more other input segments, and
a respective output segment comprises a filtered look-ahead-interval signal followed by a phase-shifted-signal in the direction the backward filter generated the output segment, each phase-shifted-signal generated by the backward filter being applied to the processing-interval signal of a respective input segment;

deriving an amplitude adjustment from amplitudes of:
  an end of the filtered look-ahead-interval signal that is adjacent to the phase-shifted signal in a specified output segment, and
  an end of the phase-shifted signal in a subsequent output segment that is opposite an end of the phase-shifted signal in the subsequent output segment that is adjacent to the filtered look-ahead-interval signal in the subsequent output segment; and applying the amplitude adjustment to the phase-shifted signal in the subsequent output segment to reduce a difference in amplitude with an end of the phase-shifted signal that is adjacent the look-ahead-interval signal in the specified output segment, wherein the amplitude adjustment is modified so that it converges to zero as it is applied to the phase-shifted signal in the forward direction.

14. The medium of claim 13, wherein the backward filter has its input coupled to the output of the forward filter and the input segments of its input signal are generated by the forward filter, and wherein the method comprises deriving at least some initial states of the backward filter prior to it being applied to the respective input segment from at least some states of the forward filter after generating at least a portion of the signal in the respective input segment.

15. A non-transitory storage medium recording a program of instructions that is executable by a processor to perform a method for filtering an input signal representing audio or video information to generate an output signal representing the audio or video information with a specified phase shift that is a non-zero function of frequency, wherein the method comprises:

receiving the input signal in a forward direction at an input terminal;

applying a forward filter and a backward filter coupled in cascade with one another to the input signal, wherein the forward filter applies its filtering operation to its input in the forward direction and the backward filter applies its filtering operation to its input in a backward direction that is opposite the forward direction, wherein the backward filter comprises a plurality of filter stages; and generating an output signal at an output terminal in response to filtered signals received from the cascade of forward and backward filters, wherein the output signal has the specified phase shift that is a non-zero function of frequency;

wherein the filtering operation of the backward filter has a phase shift that is a function of frequency and the filtering operation of the forward filter has the specified phase shift that is a non-zero function of frequency defined relative to the phase shift of the filtering operation of the backward filter;

applying the backward filter to a series of input segments of its input signal to generate its output signal in a series of output segments, wherein:
  a respective input segment comprises a look-ahead-interval signal and a processing-interval signal following the look-ahead-interval signal in the direction the backward filter is applied, the look-ahead-interval signal also being present in one or more other input segments; and
  a respective output segment comprises a filtered look-ahead-interval signal followed by a phase-shifted-signal in the direction the backward filter generated the output segment, each phase-shifted-signal generated by the backward filter being applied to the processing-interval signal of a respective input segment; and initializing states of the backward filter by:
  applying less than all of the plurality of filter stages to an initial portion of a respective look-ahead-interval signal; and
  applying an increasing number of the plurality of filter stages in successive portions of the respective look-ahead-interval signal following the initial portion such that all stages in the plurality of stages are applied by the end of the look-ahead-interval signal.

16. The medium of claim 15, wherein the backward filter has its input coupled to the output of the forward filter and the input segments of its input signal are generated by the forward filter, and wherein the method comprises deriving at least some initial states of the backward filter prior to it being applied to the respective input segment from at least some states of the forward filter after generating at least a portion of the signal in the respective input segment.

17. The medium of claim 15, wherein the method comprises:

deriving an amplitude adjustment from amplitudes of:
  an end of the filtered look-ahead-interval signal that is adjacent to the phase-shifted signal in a specified output segment, and
  an end of the phase-shifted signal in a subsequent output segment that is opposite an end of the phase-shifted signal in the subsequent output segment that is adjacent to the filtered look-ahead-interval signal in the subsequent output segment; and applying the amplitude adjustment to the phase-shifted signal in the subsequent output segment to reduce a difference in amplitude with an end of the phase-shifted signal that is adjacent the look-ahead-interval signal in the specified output segment.

18. The medium of claim 17, wherein the method comprises modifying the amplitude adjustment so that it converges to zero as it is applied to the phase-shifted signal in the forward direction.

* * * * *